United States Patent
Hamilton et al.

(10) Patent No.: US 10,006,956 B2
(45) Date of Patent: Jun. 26, 2018

(54) SYSTEMS AND METHODS FOR DETERMINING AN OPERATIONAL CONDITION OF A CAPACITOR PACKAGE

(71) Applicant: Lenovo Enterprise Solutions (Singapore) Pte. Ltd., New Tech Park (SG)

(72) Inventors: Jeffrey R. Hamilton, Pittsboro, NC (US); Michael DeCesaris, Carrboro, NC (US); Ann Richter, Research Triangle Park, NC (US); Alfredo Aldereguia, Cary, NC (US)

(73) Assignee: Lenovo Enterprise Solutions (Singapore) Pte. Ltd., New Tech Park (SG)

( * ) Notice: Subject to any disclaimer, the term of this patent is extended or adjusted under 35 U.S.C. 154(b) by 397 days.

(21) Appl. No.: 14/670,377

(22) Filed: Mar. 26, 2015

(65) Prior Publication Data

US 2016/0282405 A1    Sep. 29, 2016

(51) Int. Cl.
  *G01R 31/02*   (2006.01)
  *G01R 31/26*   (2014.01)
  G01R 31/28    (2006.01)
  H01G 4/255    (2006.01)

(52) U.S. Cl.
  CPC ........ *G01R 31/028* (2013.01); *G01R 31/2896* (2013.01); *H01G 4/255* (2013.01)

(58) Field of Classification Search
  CPC  G01R 31/016; G01R 31/028; G01R 31/2632; G01R 31/36; G01R 31/289; G01R 27/2688; G01R 27/2694; G01D 5/2405

USPC .................. 324/548, 663, 762.07
See application file for complete search history.

(56) References Cited

U.S. PATENT DOCUMENTS

| | | | | | |
|---|---|---|---|---|---|
| 2,474,415 | A | * | 6/1949 | Deyrup | G01R 31/028 324/548 |
| 2,754,478 | A | * | 7/1956 | Goldsmith | H01G 4/04 324/686 |
| 3,211,998 | A | * | 10/1965 | Kidwell | G01R 31/14 324/548 |

(Continued)

OTHER PUBLICATIONS

Brazis, Jr., The Dielectric Voltage Withstand Test, UL LLC copyright 2012.*

(Continued)

*Primary Examiner* — Patrick Assouad
*Assistant Examiner* — Sean Curtis
(74) *Attorney, Agent, or Firm* — Olive Law Group, PLLC

(57) ABSTRACT

Systems and methods for determining an operational condition of a capacitor package are disclosed. According to an aspect, a system may include a capacitor package including a dielectric material operatively connected between a first terminal and a second terminal. The system may include a Zener diode being operatively connected with its cathode at a third terminal and its anode at the second terminal. The system may also include a test pin being conductively connected to the third terminal. The system may also include a testing module configured to receive an electrical output from the test pin. The testing module may also be configured to determine an operational condition of the capacitor package based on the electrical output. The testing module may further be configured to present the operational condition of the capacitor package.

15 Claims, 6 Drawing Sheets

(56) References Cited

U.S. PATENT DOCUMENTS

| | | | | | |
|---|---|---|---|---|---|
| 3,774,237 | A | * | 11/1973 | Hardway, Jr. | G01N 27/223 324/608 |
| 3,774,238 | A | * | 11/1973 | Hardway, Jr. | G01F 23/263 137/392 |
| 4,683,417 | A | * | 7/1987 | De Burgat | G01R 31/028 324/618 |
| 4,906,939 | A | * | 3/1990 | Berrigan | G01R 1/04 324/548 |
| 5,633,591 | A | * | 5/1997 | Childress | F02P 17/12 324/399 |
| 7,838,965 | B2 | * | 11/2010 | Klee | H01L 23/5223 257/356 |
| 8,004,288 | B1 | * | 8/2011 | Sherwood | G01R 31/028 324/522 |
| 8,576,074 | B2 | * | 11/2013 | MacDougall | G01R 31/028 340/562 |
| 9,048,150 | B1 | * | 6/2015 | Roehner | H01L 22/14 |
| 2008/0136376 | A1 | * | 6/2008 | Nebrigic | H02J 7/0022 320/136 |
| 2008/0143342 | A1 | * | 6/2008 | Freeman | G01R 31/016 324/548 |
| 2008/0258257 | A1 | * | 10/2008 | Klee | H01L 23/5223 257/532 |
| 2010/0188099 | A1 | * | 7/2010 | Paulsen | G01R 31/016 324/548 |
| 2011/0198725 | A1 | * | 8/2011 | Roest | G11C 11/22 257/532 |
| 2013/0119923 | A1 | * | 5/2013 | Wright | H02J 7/0073 320/107 |
| 2015/0264763 | A1 | * | 9/2015 | Cobo | H05B 33/0821 315/245 |
| 2016/0282405 | A1 | * | 9/2016 | Hamilton | G01R 31/028 |

OTHER PUBLICATIONS

Evans, David. Determination of Capacitor Life as a Function of Operating Voltage and Temperature. Evans Capacitor Company. No date.*

* cited by examiner

SYSTEMS AND METHODS FOR DETERMINING AN OPERATIONAL CONDITION OF A CAPACITOR PACKAGE

TECHNICAL FIELD

The present disclosure relates to monitoring of electrical components, and more specifically, to determining an operational condition of a capacitor package.

BACKGROUND

Capacitors are prevalent throughout a variety of electrical devices and systems due to their ability to store voltage potential. Capacitors possess this capability due to a dielectric material contained between two terminals of the capacitor. The amount of voltage potential a capacitor can store effectively is based on the type of dielectric material within the capacitor. A dielectric material may be associated with a breakdown voltage, or a maximum voltage level at which the dielectric material can operate efficiently. Once a capacitor begins to operate at a voltage higher equal to or higher than the breakdown voltage level of the dielectric material, the capacitor may begin to operate out of specification. A capacitor operating out of specification may cause an electrical device or system that it is installed in to fail to operate.

Unfortunately, current systems and techniques for detecting whether the dielectric material of a capacitor is beginning to breakdown are either inefficient or not possible. In the manufacturing environment, each capacitor may require to be individually tested prior to installation in electrical devices or systems. Such a testing methodology is oftentimes too expensive. Further, once a capacitor is installed in an electronic device or system, it is difficult to determine when and if the capacitor is beginning to operate out of specification. For at least these reasons, there is a need for identifying when a capacitor is operating out of specification efficiently in a testing environment or deployed in electrical devices and systems.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Systems and methods for determining an operational condition of a capacitor package are disclosed. According to an aspect, a system may include a capacitor package including a dielectric material operatively connected between a first terminal and a second terminal. The system may include a Zener diode being operatively connected with its cathode at a third terminal and its anode at the second terminal. The system may also include a test pin being conductively connected at a third terminal, at the cathode of the Zener diode between the third terminal and the second terminal. The system may also include a testing module configured to receive an electrical output from the test pin. The testing module may also be configured to determine an operational condition of the capacitor package based on the electrical output. The testing module may further be configured to present the operational condition of the capacitor package.

According to another aspect, a method may be implemented at a computing device include one or more processors and memory. More particularly, the method may provide a capacitor package comprising a dielectric material operatively connected between a first terminal and a second terminal. The method may also provide a Zener diode being operatively connected between the first terminal and the third terminal. The method may also provide a test pin being conductively connected in a path with the Zener diode between the first and third terminal. The method may also comprise determining an operational condition of the capacitor package based on the electrical output. The method may further comprise presenting the operational condition of the capacitor package.

According to another aspect, a system may include a plurality of capacitor packages that each comprise a dielectric material operatively connected between a first terminal and a second terminal. They system may also include a plurality of Zener diodes, each Zener diode being operatively connected between the first terminal and the third terminal of a respective one of the capacitor packages. The system may also include a plurality of test pins that are each conductively connected in a path with the Zener diode between respective first and third terminals. The system may also include a testing module configured to receive an electrical output from the test pins. The testing module may also be configured to determine an operational condition of the capacitor packages based on the electrical outputs. The testing module may further be configured to present the operational condition of the capacitor packages.

BRIEF DESCRIPTION OF THE DRAWINGS

The foregoing summary, as well as the following detailed description of various embodiments, is better understood when read in conjunction with the appended drawings. For the purposes of illustration, there is shown in the drawings exemplary embodiments; however, the presently disclosed subject matter is not limited to the specific methods and instrumentalities disclosed. In the drawings.

DETAILED DESCRIPTION

The presently disclosed subject matter is described with specificity to meet statutory requirements. However, the description itself is not intended to limit the scope of this patent. Rather, the inventors have contemplated that the claimed subject matter might also be embodied in other ways, to include different steps or elements similar to the ones described in this document, in conjunction with other present or future technologies. Moreover, although the term "step" may be used herein to connote different aspects of methods employed, the term should not be interpreted as implying any particular order among or between various steps herein disclosed unless and except when the order of individual steps is explicitly described.

As referred to herein, the term "computing device" should be broadly construed. It can include any type of device capable of presenting content to a user. The computing device may be server. In another example, the computing device may include a display, one or more speakers, a printer, or other user interface for presenting content and for receiving input from a user. In another example, a computing device may be a mobile device such as, for example, but not limited to, a smart phone, a cell phone, a pager, a personal digital assistant (PDA, e.g., with GPRS NIC), a mobile computer with a smart phone client, or the like. A computing device can also include any type of conventional computer, for example, a desktop computer or a laptop computer.

As referred to herein, a "user interface" (UI) is generally a system by which users interact with a computing device. An interface can include an input for allowing users to manipulate a computing device, and can include an output for allowing the system to present information (e.g., e-book content) and/or data, indicate the effects of the user's manipulation, etc. An example of an interface on a computing device includes a graphical user interface (GUI) that allows users to interact with programs in more ways than typing. A GUI typically can offer display objects, and visual indicators, as opposed to text-based interfaces, typed command labels or text navigation to represent information and actions available to a user. For example, an interface can be a display window or display object, which is selectable by a user of a computing device for interaction. The display object can be displayed on a display screen of a computing device and can be selected by and interacted with by a user using the interface. In an example, the display of the computing device can be a touch screen, which can display the display icon and content.

Figure 1:
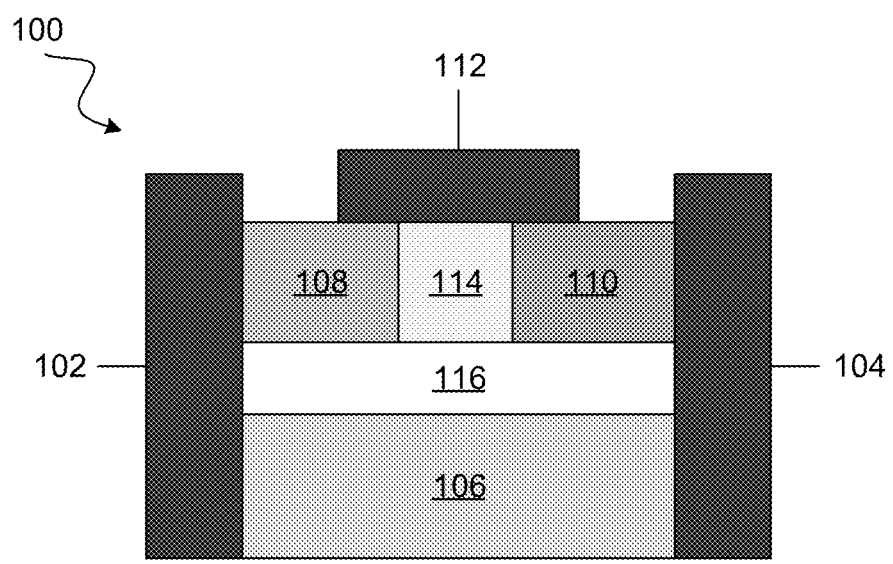
FIG. 1 is a schematic diagram of an example capacitor package in accordance with embodiments of the present disclosure.

The present disclosure is now described in more detail. For example, FIG. 1 illustrates a schematic diagram of an example capacitor package 100 in accordance with embodiments of the present disclosure. Referring to FIG. 1, the capacitor package 100 includes a first terminal 102, a second terminal 104, and a dielectric material 106 operatively connected between the first and second terminals 102 and 104. In examples, the dielectric material 106 may be made of, but is not limited to, ceramic, plastic film, liquid or gel electrolyte, solid polymer electrolyte, glass, mica. However, it should be understood that any type of dielectric material may be used in accordance with embodiments of the present disclosure and are not limited to the examples provided herein above.

With continuing reference to FIG. 1, the capacitor package 100 may include a Zener diode 108 and a resistor 110 operatively connected to a third terminal 112. It is noted that the resistor 110 is optional and may be omitted. In the instance of the resistor 110 being omitted, the diode 108 may be connected in any suitable electrical path between the terminals 104 and 112.

The diode 108 and the resistor 110 may be operatively connected in series between the first terminal 102 and the second terminal 104 via a conductive material 114 as depicted. In examples, the conductive material 114 may be made of, but is not limited to, a metal layer in a semiconductor, wire bonds, metal plating, and the like. However, it should be understood that any type of conductive material may be used in accordance with embodiments of the present disclosure and are not limited to the examples provided herein above. As shown in FIG. 1, the dielectric material 106, the diode 108, and the resistor 110 are separated by a non-conductive material 116. In accordance with embodiments, the non-conductive material 116 may be silicon dioxide, silicon nitride, and the like. However, it should be understood that any type of non-conductive material may be used in accordance with embodiments of the present disclosure and are not limited to the examples provided herein above. The capacitor package 100 may be operated as disclosed herein for testing its operational condition.

Figure 2:
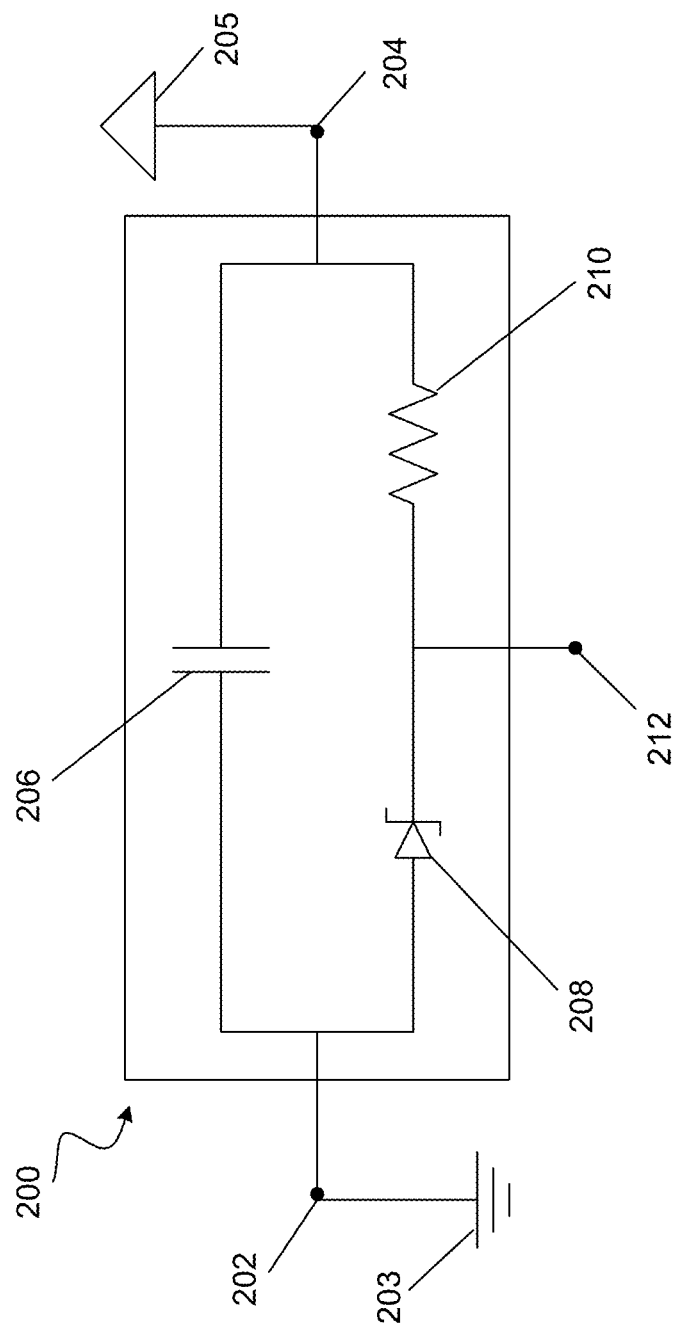
FIG. 2 is a circuit diagram of an example capacitor package connected to a voltage source in accordance with embodiments of the present disclosure.

FIG. 2 illustrates a circuit diagram of an example capacitor package connected to a voltage source in accordance with embodiments of the present disclosure. This may be, for example, the circuit diagram corresponding to the capacitor package 100 shown in FIG. 1. Referring to FIG. 2, the capacitor package 200 may include a first terminal 202 operatively connected to a reference ground 203 and a second terminal 204 operatively connected to a voltage source 205. The capacitor package 200 may include a capacitor 206 operatively connected between the first and second terminals 202 and 204. The capacitor 206 may be representative of the capacitor formed by the dielectric material 106 and the terminals 102 and 104 shown in FIG. 1.

With continuing reference to FIG. 2, the capacitor package 200 includes a diode 208 and a resistor 210 operatively connected to a third terminal 212 and being operatively connected in series between the first terminal 202 and the second terminal 204. The resistor 210 may be omitted as mentioned with respect to FIG. 1. The diode 208 and the resistor 210 corresponds to the diode 108 and the resistor 110, respectively, shown in FIG. 1. The diode 208 and the resistor 210 may be operatively connected in parallel to the capacitor 206 as shown in FIG. 2.

Figure 3:
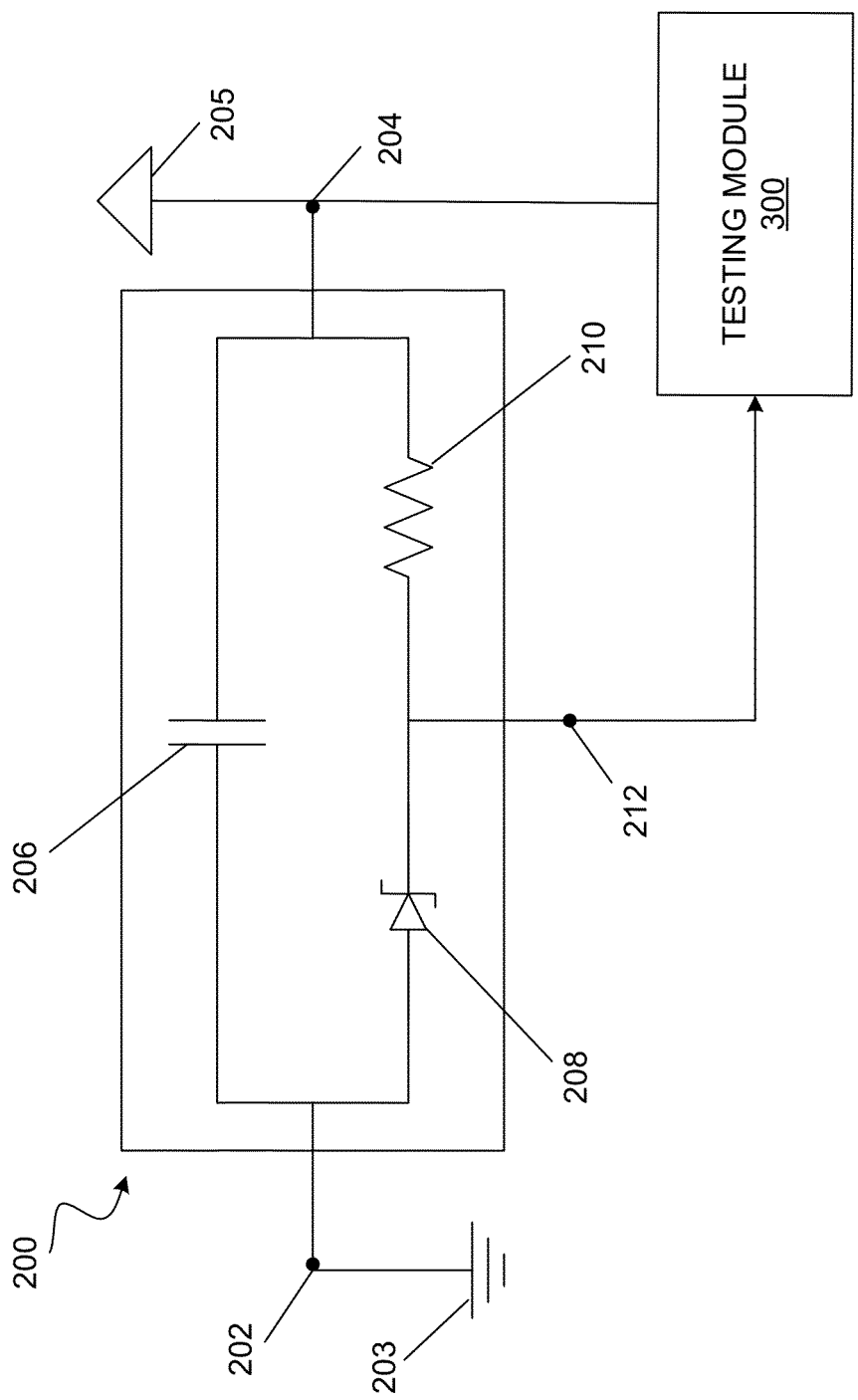
FIG. 3 is a schematic diagram of an example system for determining an operational condition of a capacitor package based on an electrical output of the capacitor package in accordance with embodiments of the present disclosure.

FIG. 3 illustrates a schematic diagram of an example system for determining an operational condition of a capacitor package in accordance with embodiments of the present disclosure. The operational condition may be determined based on an electrical output of the capacitor package. For example, the system may include a testing module 300 configured to determine an operational condition of capacitor package 302 based on an electrical output of the capacitor package 302. In accordance with embodiments, the testing module 300 may include any computing device or system configured for determining the operational condition of the capacitor package 200.

As an example, the test module 300 may be an In-Circuit Test (ICT) fixture and system on a circuit board assembly line. An ICT fixture may have probes, sometimes likened to a 'bed of nails,' that can touch a circuit board assembly in predefined places. A system which controls the fixture can apply power, measure voltages, measure impedances, drive signals, and the like. After the parts are assembled (soldered) on the board, the board may be placed in the fixture and the ICT system can subsequently apply power, measure the voltage between the capacitor terminals 204 and 202, and compare that with the voltage measured between terminal 212 and 202. The avalanche breakdown of the Zener diode may be tuned to indicate the rated voltage of the capacitor between terminals 212 and b, e.g. 2V, 3.3V, 5V, etc. If the actual voltage across the capacitor (between terminals 212 and 202) is greater than the rated voltage (between terminals 204 and 202) then the ICT system may flag the test as a failure, since the capacitor has been placed in a dangerous environment.

Figure 4:
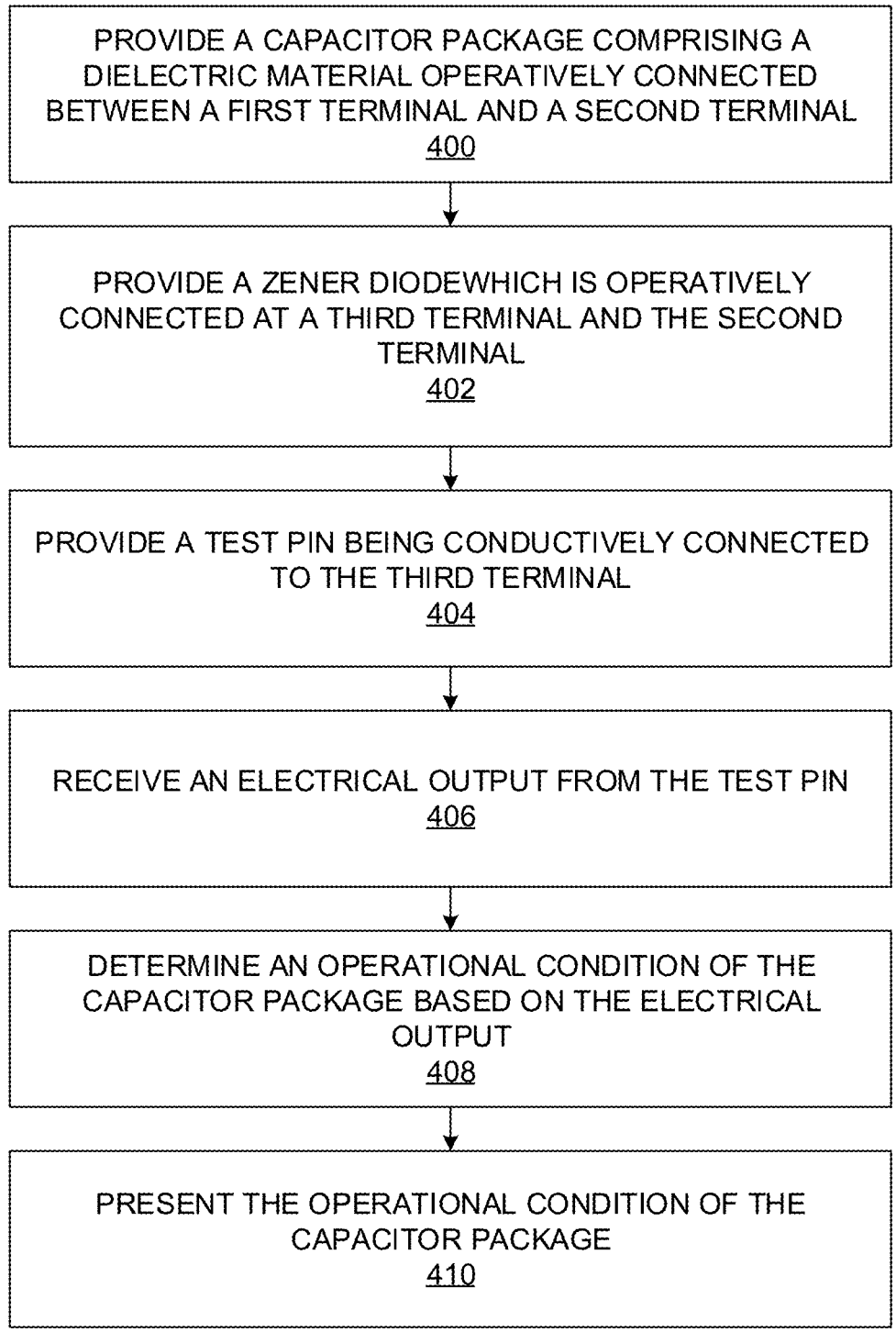
FIG. 4 is a flowchart of an example method of determining an operational condition of the capacitor package based on an electrical output of the capacitor package in accordance with embodiments of the present disclosure.

In accordance with embodiments of the present disclosure, FIG. 4 illustrates a flowchart of an example method of determining an operational condition of the capacitor package based on an electrical output of the capacitor package. The method of FIG. 4 is described by example as being implemented by the system of FIG. 3, which is the circuit that corresponds to the capacitor package shown in FIG. 2. However, it should be understood the method may alternatively be implemented by any suitable system.

Referring to FIG. 4, the method includes providing 400 a capacitor package comprising a dielectric material operatively connected between a first terminal and a second terminal. For example, the system of FIG. 3 provides the capacitor package 200 including a capacitor 206 comprising a dielectric material operatively connected between a first terminal 202 and a second terminal 204.

The method of FIG. 4 also includes providing 402 a Zener diode which is operatively connected at a third terminal and the second terminal. Continuing the aforementioned example, the capacitor package shown in FIG. 3 includes a diode 208 and resistor 210 operatively connected at a third terminal 212. The diode 208 and resistor 210 are operatively connected in series between the first terminal 202 and the second terminal 204. The method of FIG. 4 also includes providing 404 a test pin that is conductively connected to the third terminal. For example, the terminal 212 of the capacitor package 200 shown in FIG. 3 may function as a test pin.

Returning to FIG. 4, the method also includes receiving 406 an electrical output from the test pin. Continuing the aforementioned example, as shown in FIG. 3, the testing module 300 may be configured to receive an electrical output from the third terminal 212 of the capacitor package 200 via the test pin at terminal 212. The method of FIG. 4 also includes determining 408 an operational condition of the capacitor package based on the electrical output. For example, the testing module 300 of FIG. 3 may be configured to determine an operational condition of the capacitor package 200 based on the electrical output from the test pin at terminal 212. In accordance with embodiments, the step of determining 408 may include applying a voltage across the first and second terminals while the operational condition of the capacitor package is being determined. For example, FIG. 3 illustrates the testing module 300 may be configured to apply a voltage VS across the first terminal 204 and the second terminal 203 while the operational condition of the capacitor package 200 is determined.

Figure 5:
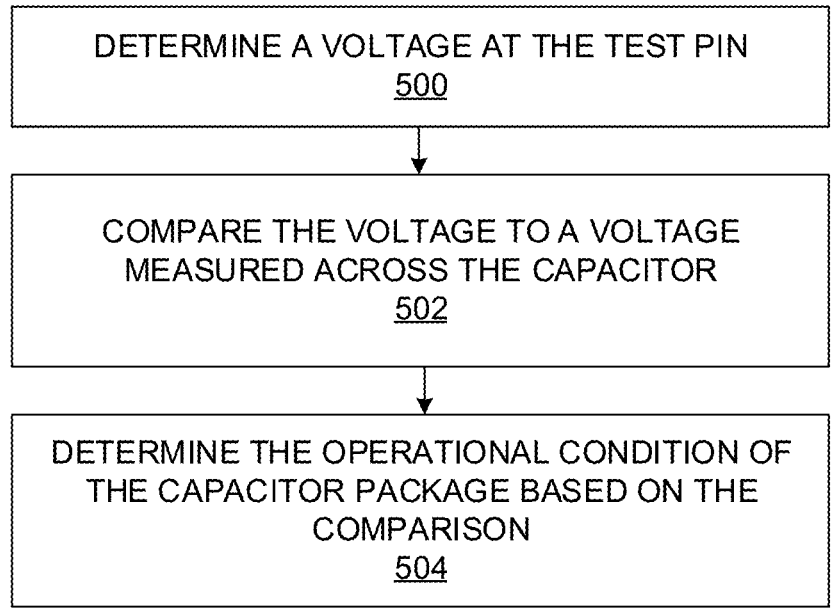
FIG. 5 is a flowchart of an example method of determining an operational condition of the capacitor package based on a comparison of a first voltage to a predetermined voltage in accordance with embodiments of the present disclosure.

FIG. 5 illustrates another example method of determining an operational condition of an capacitor package in accordance with embodiments of the present disclosure. The method is described as being implemented by the system shown in FIG. 3, although it should be understood that the method may alternatively be implemented by any suitable system.

Referring to FIG. 5, the method includes determining 500 a voltage at a test pin. The method also includes comparing 502 the voltage to the voltage measured across the capacitor. For example, after applying power to the PCB assembly containing the capacitor, the testing module 300 of FIG. 3 may determine a voltage at the test pin at terminal 212 with respect to terminal 202, using a method consistent with testing Zener diodes. The testing module 300 may assume that the voltage measured at terminal 212 is the pre-determined rated voltage for the capacitor, above which dielectric breakdown may start to occur. The testing module may subsequently determine the voltage at terminal 204 with respect to terminal 202. The testing module 300 may compare the voltage at the test pin at terminal 212 to the voltage at terminal 204, and if the voltage at terminal 204 is larger then the capacitor has been placed in an environment beyond its rated voltage. In an example, the predetermined voltage may be associated with a breakdown voltage. There can be a large range of max voltage ratings for capacitors depending on capacitor type, size, and value, from under 10V to over 7500V, but typically the capacitors of interest at a PCB level are in the under 10V to 50V range (examples are 2.5V, 3.0V, 4.0V, 6.3V, 10V, 16V, 25V, 35V, 40V, 50V, etc.)

The method of FIG. 5 includes determining 504 the operational condition of the capacitor package based on the comparison. Continuing the aforementioned example, the testing module 300 may determine the operational condition of the capacitor package 200 based on the comparison of the voltage measured at the test pin at terminal 212 to the voltage associated with capacitor 206. In accordance with embodiments, the method may include indicating whether the capacitor package is operating out of specification. For example, the testing module 300 may determine the voltage measured at the test pin at terminal 212 is less than the voltage associated with capacitor 206. In another example, the testing module 300 may determine the measured voltage at the test pin at terminal 212 is equal to n a breakdown voltage associated with the capacitor 206. In either of these examples, testing module 300 may indicate the capacitor package 200 is operating out of specification.

Figure 6:
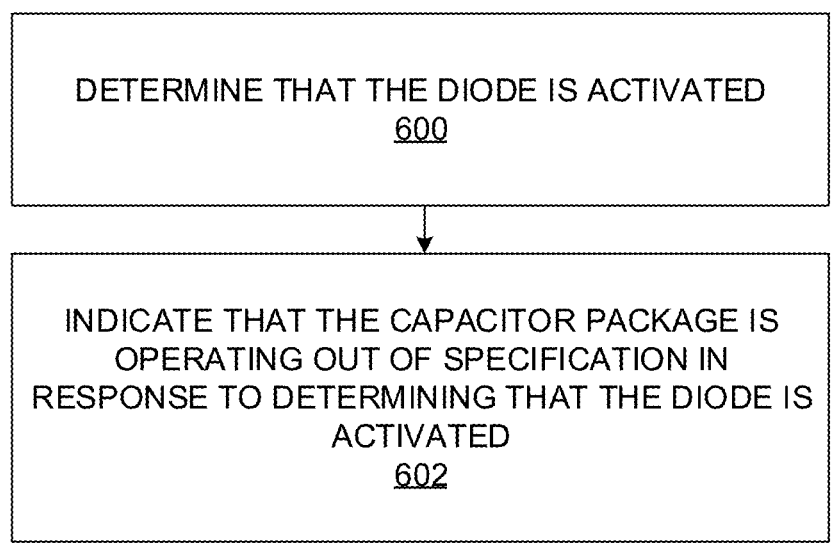
FIG. 6 is a flowchart of an example method of indicating that the capacitor package is operating out of specification in response to determining that a diode of the capacitor package is activated in accordance with embodiments of the present disclosure.

In accordance with embodiments of the present disclosure, FIG. 6 illustrates an example method of indicating that the capacitor package is operating out of specification in response to determining that a diode of the capacitor package is activated. The method is described in this example as being implemented by the system shown in FIG. 3, but it should be understood that the method can be implemented by any suitable system.

Referring to FIG. 6, the method includes determining 600 that the diode is activated. For example, the testing module 300 shown in FIG. 3 may determine that the diode 208 is activated. As an example, the diode 208 may be configured to activate in response to a voltage across the first terminal 202 and the second terminal 204 being greater than a predetermined voltage value. Also, the resistor 210 may be configured to operate with the diode 208 such that diode 208 activates when voltage applied across the first and second terminals 202 and 204 is greater than a predetermined voltage value.

The resistor 210 may have a resistance value such that the diode 208 activates when the voltage across the first terminal 202 and the second terminal 204 is greater than the predetermined voltage value. In an example, the resistor 210 may be a trimming resistor. It is noted that in embodiments the resistor 210 may be omitted or not included.

The method of FIG. 6 includes indicating 600 that the capacitor package is operating out of specification in response to determining that the diode is activated. For example, the testing module 300 may indicate that the capacitor package 200 is operating out of specification in response to determining the diode 208 is activated.

Returning to FIG. 4, the method also includes presenting 410 the operational condition of the capacitor package. For example, the testing module 300 may be configured to present the operational condition of capacitor package 200. In an example, the testing module may include a user interface configured to present the operational condition of the capacitor package 200 to a user. In an example, operational condition information may be in the form of a report on all tested components after an ICT run. As an example, a failure report on a video screen may be displayed to point out a measured capacitor max voltage rating and a voltage across the capacitor during the powered test.

Figure 7:
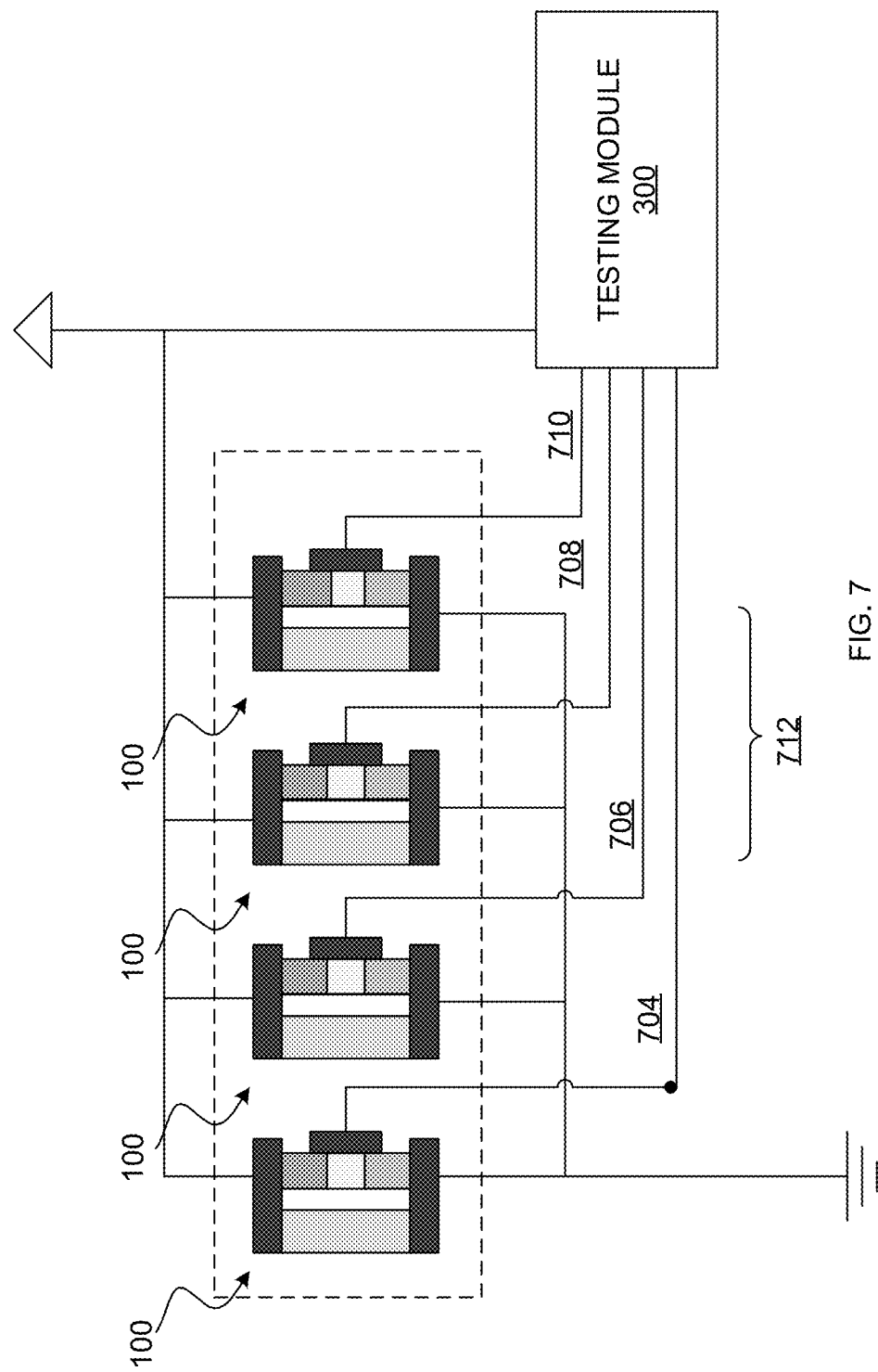
FIG. 7 is a schematic diagram of an example testing module configured to determine an operational condition of a plurality of capacitor packages based on electrical outputs of the plurality of capacitor packages in accordance with embodiments of the present disclosure.

FIG. 7 is a system diagram illustrating an example testing module configured to determine an operational condition of a plurality of capacitor packages based on electrical outputs of the plurality of capacitor packages in accordance with embodiments of the present disclosure. Referring to FIG. 7, the system includes a testing module 300 and multiple capacitor packages 100 that each comprise a dielectric material operatively connected between a first terminal and a second terminal. The capacitor packages can be the capacitor package 100 shown in FIG. 1, or any other suitable capacitor package. Also, shown in FIG. 7 are multiple test pins 704, 706, 708, and 710, that are each conductively connected to a respective third terminal of the capacitor packages 100.

The testing module 300 of FIG. 7 may be configured to receive electrical outputs from each of the test pins 704, 706, 708, and 710. For example, the testing module 300 can be configured to receive the electrical outputs from the test pins 704, 706, 708, and 710, and 712 via a test rail 712. The testing module 300 may determine operational conditions of the capacitor packages 100 based on the electrical outputs from the test pins 704, 706, 708, and 710. In accordance with embodiments, the testing module 700 may also be configured to determine whether each diode of the diode and resistor pairs of the plurality of capacitor packages 702 is activated. In a similar manner as the diode 208 of FIG. 3, the diodes of each diode and resistor pair of FIG. 7 are configured to activate in response to a voltage across the respective first terminal and the respective second terminal of the respective capacitor package being greater than a predetermined voltage value. Also in similar manner as the resistor 210 of FIG. 3, the resistor of each diode and resistor pair of FIG. 7 is configured to operate with the diode such that the diode activates when the voltage across the respective first and second terminals is greater than the predetermined voltage value.

In response to determining that one of the diodes is activated, the testing module 300 may be configured to indicate that a capacitor package is operating out of specification. In an example, a Zener diode may be specifically tuned to avalanche at the rated voltage of the capacitor, so the testing module may always "discover" the rated voltage of each capacitor prior to comparing it with the actual voltage across the cap.

Returning to FIG. 7, the testing module 300 may present the operational conditions of the capacitor packages. In accordance with embodiments, system of FIG. 7 may comprise a user interface configured to present the operational conditions of the capacitor packages 100 to a user.

The various techniques described herein may be implemented with hardware or software or, where appropriate, with a combination of both. Thus, the methods and apparatus of the disclosed embodiments, or certain aspects or portions thereof, may take the form of program code (i.e., instructions) embodied in tangible media, such as floppy diskettes, CD-ROMs, hard drives, or any other machine-readable storage medium, wherein, when the program code is loaded into and executed by a machine, such as a computer, the machine becomes an apparatus for practicing the presently disclosed subject matter. In the case of program code execution on programmable computers, the computer will generally include a processor, a storage medium readable by the processor (including volatile and non-volatile memory and/or storage elements), at least one input device and at least one output device. One or more programs may be implemented in a high level procedural or object oriented programming language to communicate with a computer system. However, the program(s) can be implemented in assembly or machine language, if desired. In any case, the language may be a compiled or interpreted language, and combined with hardware implementations.

The described methods and apparatus may also be embodied in the form of program code that is transmitted over some transmission medium, such as over electrical wiring or cabling, through fiber optics, or via any other form of transmission, wherein, when the program code is received and loaded into and executed by a machine, such as an EPROM, a gate array, a programmable logic device (PLD), a client computer, a video recorder or the like, the machine becomes an apparatus for practicing the presently disclosed subject matter. When implemented on a general-purpose processor, the program code combines with the processor to provide a unique apparatus that operates to perform the processing of the presently disclosed subject matter.

Features from one embodiment or aspect may be combined with features from any other embodiment or aspect in any appropriate combination. For example, any individual or collective features of method aspects or embodiments may be applied to apparatus, system, product, or component aspects of embodiments and vice versa.

While the embodiments have been described in connection with the various embodiments of the various figures, it is to be understood that other similar embodiments may be used or modifications and additions may be made to the described embodiment for performing the same function without deviating therefrom. Therefore, the disclosed embodiments should not be limited to any single embodiment, but rather should be construed in breadth and scope in accordance with the appended claims.

What is claimed:
1. A system comprising:
   a capacitor package comprising:
      a dielectric material operatively connected between a first terminal and a second terminal;
      a Zener diode being operatively connected with its cathode at a third terminal, and its anode at the second terminal;
      a resistor and a conductive material operatively connected in series with the Zener diode between the first terminal and the second terminal;
      a non-conductive material connected between the first terminal and the second terminal, and positioned to separate the dielectric material from the Zener diode, the conductive material, and the resistor; and
      a test pin being conductively connected at the third terminal in a path with the cathode of the Zener diode; and
   a testing module configured to:
      test a Zener diode to determine its avalanche voltage;
      determine an operational condition of the capacitor package based on the voltage across the capacitor and the avalanche voltage of the Zener diode; and
      present the operational condition of the capacitor package, wherein the testing module comprises a voltage source configured to apply a voltage across the first and second terminals while the operational condition of the capacitor package is being determined.

2. A system comprising:
a capacitor package comprising:
   a dielectric material operatively connected between a first terminal and a second terminal;
   a Zener diode being operatively connected with its cathode at a third terminal, and its anode at the second terminal;
   a resistor and a conductive material operatively connected in series with the Zener diode between the first terminal and the second terminal;
   a non-conductive material connected between the first terminal and the second terminal, and positioned to separate the dielectric material from the Zener diode, the conductive material, and the resistor; and
   a test pin being conductively connected at the third terminal in a path with the cathode of the Zener diode; and
a testing module configured to:
   test a Zener diode to determine its avalanche voltage;
   determine a first voltage at the test pin;
   determine a second voltage the first terminal and the second terminal across the capacitor;
   compare the first voltage to the second voltage;
   determine an operational condition of the capacitor based on the comparison of the voltage across the capacitor and the avalanche voltage of the Zener diode; and
   present the operational condition of the capacitor package.

3. The system of claim 2, wherein the testing module is configured to indicate whether the capacitor package is operating out of specification based on the comparison.

4. The system of claim 1, further comprising a resistor in series with the Zener diode, and wherein the Zener diode is configured to activate in response to a voltage across the first terminal and the second terminal being greater than a predetermined voltage value, and
wherein the testing module is configured to:
   determine that the Zener diode is activated; and
   indicate that the capacitor package is operating out of specification in response to determining that the Zener diode is activated.

5. The system of claim 4, wherein the resistor is configured to operate with the Zener diode such that the Zener diode activates when the voltage across the first and second terminals is greater than the predetermined voltage value.

6. The system of claim 1, further comprising a user interface configured to present the operational condition of the capacitor package to a user.

7. A method comprising:
providing a capacitor package comprising:
   a dielectric material operatively connected between a first terminal and a second terminal;
   a Zener diode being operatively connected between the third terminal and the second terminal;
   a resistor and a conductive material operatively connected in series with the Zener diode between the first terminal and the second terminal;
   a non-conductive material connected between the first terminal and the second terminal, and positioned to separate the dielectric material from the Zener diode, the conductive material, and the resistor; and
   a test pin being conductively connected to the third terminal;
determining a first voltage at the test pin;
determining a second voltage across the first terminal and the second terminal;
comparing the first voltage to the second voltage;
determining an operational condition of the capacitor package based on the comparison; and
presenting the operational condition of the capacitor package.

8. The method of claim 7, further comprising applying a voltage across the first and second terminals while the operational condition of the capacitor package is being determined.

9. The method of claim 7, further comprising indicating whether the capacitor package is operating out of specification.

10. The method of claim 7, further comprising a resistor in series with the Zener diode, and wherein the Zener diode is configured to activate in response to a voltage across the first terminal and the second terminal being greater than a predetermined voltage value, and
wherein the method further comprises:
   determining that the Zener diode is activated; and
   in response to determining that the Zener diode is activated, indicating that the capacitor package is operating out of specification.

11. The method of claim 10, wherein the resistor is configured to operate with the Zener diode such that the Zener diode activates when the voltage across the first and second terminals is greater than the predetermined voltage value.

12. The method of claim 7, further comprising using a user interface to present the operational condition of the capacitor package to a user.

13. A system comprising:
   a plurality of capacitor packages that each comprise a dielectric material operatively connected between a first terminal and a second terminal;
   a plurality of Zener diodes, each Zener diode being operatively connected between the third terminal and the second terminal of a respective one of the capacitor packages;
   a plurality of test pins that are each conductively connected to a respective third terminal of a capacitor package;
   a plurality of resistors that are each in series with a respective Zener diode, and wherein the Zener diodes are each configured to activate in response to a voltage across the respective first terminal and the respective second terminal of the respective capacitor package being greater than a predetermined voltage value; and
   a testing module configured to:
      receive electrical outputs from the test pins to ascertain whether each Zener diode is activated;
      determine operational conditions of the capacitor packages based on the electrical outputs;
      present the operational conditions of the capacitor packages; and
      indicate that the capacitor package is operating out of specification in response to ascertaining that one of the Zener diodes is activated,
      wherein the testing module comprises a voltage source configured to apply a voltage across the first and second terminals while the operational conditions of the capacitor packages are being determined.

14. The system of claim 13, wherein the resistor of each Zener diode is configured to operate such that the Zener diode activates when the voltage across the respective first and second terminals is greater than the predetermined voltage value.

15. The system of claim 13, further comprising a user interface configured to present the operational conditions of the capacitor packages to a user.

* * * * *